United States Patent
Generazio

(10) Patent No.: US 10,024,900 B2
(45) Date of Patent: Jul. 17, 2018

(54) SOLID STATE EPHEMERAL ELECTRIC POTENTIAL AND ELECTRIC FIELD SENSOR

(71) Applicant: The United States of America as represented by the Administrator of the National Aeronautics and Space Administration, Washington, DC (US)

(72) Inventor: Edward R. Generazio, Yorktown, VA (US)

(73) Assignee: UNITED STATES OF AMERICA AS REPRESENTED BY THE ADMINISTRATOR OF NASA., Washington, DC (US)

( * ) Notice: Subject to any disclaimer, the term of this patent is extended or adjusted under 35 U.S.C. 154(b) by 176 days.

(21) Appl. No.: 15/177,798

(22) Filed: Jun. 9, 2016

(65) Prior Publication Data

US 2017/0356942 A1  Dec. 14, 2017

(51) Int. Cl.
*G01R 29/12* (2006.01)
*H01L 29/788* (2006.01)
(Continued)

(52) U.S. Cl.
CPC ............ *G01R 29/12* (2013.01); *H01L 27/088* (2013.01); *H01L 29/788* (2013.01); *H01L 27/2454* (2013.01); *H01L 29/778* (2013.01)

(58) Field of Classification Search
CPC ........ G01R 29/00; G01R 29/08; G01R 29/12; G01R 29/24; G01R 5/00; G01R 5/28;
(Continued)

(56) References Cited

U.S. PATENT DOCUMENTS 3,819,954 A * 6/1974 Butler ................... G11C 27/04
                                                        257/216
4,068,254 A * 1/1978 Erdi .................... H01L 27/0722
                                                        257/273
(Continued)

FOREIGN PATENT DOCUMENTS

GB          2132357 A      7/1982
WO    WO2002067015 A1     8/2002
(Continued)

OTHER PUBLICATIONS

Ashcroft, Neil W. et al., "Solid State Physics," p. 592. Holt, Rinehart and Winston.
(Continued)

*Primary Examiner* — Hoai-An D Nguyen
(74) *Attorney, Agent, or Firm* — Jonathan B. Soike; Jennifer L. Riley; Mark P. Dvorscak

(57) ABSTRACT

Systems, methods, and devices of the various embodiments provide a field effect transistor (FET) that controls equilibrium by reversing the effects of leakage currents affecting the gate response of the FET by using an equilibrium pump electrode. The equilibrium reversing gate FETs (ergFETs) of the various embodiments, may include an equilibrium pump electrode located within a non-conducting gap. The ergFETs of the various embodiments may provide solid state ephemeral electric potential and electric field sensor systems and methods for measuring ephemeral electric potentials and electric fields.

20 Claims, 13 Drawing Sheets

(51) Int. Cl.
*H01L 27/088* (2006.01)
*H01L 29/778* (2006.01)
*H01L 27/24* (2006.01)

(58) Field of Classification Search
CPC .. G01R 15/165; G01R 19/00; G01R 19/0023; H01L 27/00; H01L 27/02; H01L 27/04; H01L 27/08; H01L 27/085; H01L 27/088; H01L 29/788; H01L 21/8232; H01L 27/0617; H01L 27/0705; H01L 27/105; H01L 27/11803; H01L 27/228; H01L 27/2454; H01L 27/283; H01L 29/66378; H01L 29/66431; H01L 29/66462; H01L 29/737; H01L 29/778; H01L 29/78687
USPC ......... 324/457, 76.11, 109; 257/27, 69, 124, 257/133, 183, 192, 213, 256, 259, 272, 257/274, 288, 327, 338, 351, 369
See application file for complete search history.

(56) References Cited

U.S. PATENT DOCUMENTS

| | | | |
|---|---|---|---|
| 4,314,251 A | | 2/1982 | Raab |
| 4,765,184 A | * | 8/1988 | Delatorre ............... E21B 47/06 327/362 |
| 4,894,607 A | | 1/1990 | Kumada |
| 4,931,740 A | | 6/1990 | Hassanzadeh et al. |
| 5,019,804 A | | 5/1991 | Fraden |
| 5,164,673 A | | 11/1992 | Rosener |
| 5,430,381 A | | 7/1995 | Dower |
| 5,986,456 A | | 11/1999 | Yamashita |
| 6,025,726 A | | 2/2000 | Gershenfeld et al. |
| 6,031,378 A | | 2/2000 | Rosin |
| 6,661,115 B2 | | 12/2003 | Lester |
| 6,762,726 B2 | | 7/2004 | Alden et al. |
| 7,119,553 B2 | | 10/2006 | Yang et al. |
| 7,141,987 B2 | | 11/2006 | Hibbs et al. |
| 7,154,275 B2 | | 12/2006 | Zank et al. |
| 7,242,298 B2 | | 7/2007 | Cehelnik |
| 7,295,019 B2 | | 11/2007 | Yang et al. |
| 7,315,173 B2 | | 1/2008 | Funato et al. |
| 7,330,032 B2 | | 2/2008 | Donnangelo |
| 7,471,089 B2 | | 12/2008 | Zerilli et al. |
| 9,279,719 B2 | | 3/2016 | Gemerazio |
| 2003/0118361 A1 | | 6/2003 | Shimmura |
| 2005/0073322 A1 | | 4/2005 | Hibbs et al. |
| 2005/0212055 A1 | * | 9/2005 | Nakabayashi .... H01L 29/66643 257/369 |
| 2006/0071669 A1 | | 4/2006 | Funato et al. |
| 2006/0164094 A1 | | 7/2006 | Golder et al. |
| 2006/0220635 A1 | | 10/2006 | Kazama et al. |
| 2006/0281249 A1 | * | 12/2006 | Yilmaz ............. H01L 29/66727 438/243 |
| 2007/0025171 A1 | * | 2/2007 | Kuroda ................... G11C 8/10 365/212 |
| 2007/0040545 A1 | | 2/2007 | Takiguchi |
| 2008/0246485 A1 | | 10/2008 | Hibbs et al. |
| 2008/0303530 A1 | | 12/2008 | Coutsornitros et al. |
| 2009/0284405 A1 | | 11/2009 | Salmon et al. |
| 2009/0295366 A1 | | 12/2009 | Cehelnik |
| 2009/0295644 A1 | | 12/2009 | Curran et al. |
| 2009/0309604 A1 | | 12/2009 | Zhang |
| 2010/0250140 A1 | | 9/2010 | Constable et al. |
| 2010/0259272 A1 | | 10/2010 | Care |
| 2010/0271291 A1 | | 10/2010 | Care |
| 2012/0013354 A1 | | 1/2012 | Bowler |
| 2012/0092019 A1 | | 4/2012 | Blum |
| 2016/0049885 A1 | | 2/2016 | Generazo et al. |

FOREIGN PATENT DOCUMENTS

| WO | WO2003081265 A1 | 10/2003 |
|---|---|---|
| WO | WO2008152588 A2 | 12/2008 |

OTHER PUBLICATIONS

Horowitz, P. et al., "The Art of Electronics," 1989, 2nd Ed., p. 136, Cambridge University Press.

Generazio, Edward R. et al., "Free-Carrier Absorption in a Quantizing Magnetic Fields," Physical Review B, Dec. 15, 1979, vol. 20, No. 12.

Alpha Lab Inc. (Oct. 28, 2016). Retrieved Oct. 2016, 2016, from Alpha Lab Inc: https://www.infield.com/content/tribo-electric-senes/, Accessed Feb. 1, 2017.

Generazio E.R., "Electric Potential and Electric Field Imaging with Applications. Materials Evaluation," Nov. 1, 2015, pp. 1479-1489, 73(11).

Jackson, J. D., "Classical Electrodynamics," 1999, (3rd ed.), Chapters 4 and 9, Wiley & Sons, New York, NY.

* cited by examiner

SOLID STATE EPHEMERAL ELECTRIC
POTENTIAL AND ELECTRIC FIELD
SENSOR

STATEMENT REGARDING FEDERALLY
SPONSORED RESEARCH OR DEVELOPMENT

The invention described herein was made by an employee of the United States Government and may be manufactured and used by or for the Government of the United States of America for governmental purposes without the payment of any royalties thereon or therefore.

BACKGROUND OF THE INVENTION

The present invention relates to sensors, and more particularly to sensors for measurements of electric potentials and electric fields.

With an electric field sensor it is possible to measure the true quantitative electric potential and electrostatic field emanating from, passing through, and around objects, or in free space. A quasi-static electric field generator that safely "illuminates" large volumes with a uniform electrostatic field can be used with an electric field sensor to allow for the measurement of the true metric of electrostatic fields emanating from, passing through, or around objects and volumes. The electric field sensor and quasi-static electric field generator can be used together to provide quantitative metrics of the electrostatic potential, the electrostatic field strength, the spatial direction of the electrostatic field, and the spatial components of the electrostatic field.

However, while some prior work has claimed to measure electrostatic fields, these prior methods do not necessarily provide measurements of the true electrostatic field. Inaccuracies in the measurement arise due to the lack in attention to details describing the construction of the sensor, the components used, and the supporting structure. For example, FIG. 1 illustrates two images 100 and 103 of electrostatic potential distortions around a 26 AWG cable 102 with a 0.256 cm outer jacket diameter and a LM324 Operational Amplifier 104 with a 10 millimeter by 20 millimeter top surface. Image 100 shows the actual electrostatic potential distortion around the cable 102 carrying no current. As seen in image 100, the electrostatic potential distortions have extremely large spatial distributions compared to the cable 102 diameter, and the electrostatic potential ranges from negative 3 volts in the lightest areas to negative 2 voltage in the darkest areas. To generate image 103 the LM324 Operational Amplifier 105 was oriented normal to the reference electric field. As seen in image 103, the electrostatic potential distortions have extremely large spatial distributions compared to the LM324 Operational Amplifier 105 dimensions, and the electrostatic potential ranges from negative 4 volts in the lightest areas to negative 3 voltage in the darkest areas. Images 100 and 103 show that when placed in a uniform electric field, a conducting cable and integrated circuit both will dramatically disturb the previously uniform electrical potential. The potential changes due to the objects are not uniform, where the presence of the cable increases the potential and the presence of the integrated circuit can decrease the potential. These electrostatic distortions prohibit the measurement of the true electric potential and true electrostatic field, such that prior measurement configuration using these conducting cables and integrated circuits (or other similar types of components) have yielded erroneous results and have not provided measurements of the true electrostatic field.

BRIEF SUMMARY OF THE INVENTION

The systems, methods, and devices of the various embodiments provide a field effect transistor (FET) that controls equilibrium by reversing the effects of leakage currents affecting the gate response of the FET by using an equilibrium pump electrode. The equilibrium reversing gate FETs (ergFETs) of the various embodiments, may include an equilibrium pump electrode located within a non-conducting gap. The ergFETs of the various embodiments may provide solid state ephemeral electric potential and electric field sensor systems and methods for measuring ephemeral electric potentials and electric fields.

These and other features, advantages, and objects of the present invention will be further understood and appreciated by those skilled in the art by reference to the following specification, claims, and appended drawings.

BRIEF DESCRIPTION OF THE SEVERAL
VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

Figure 6:
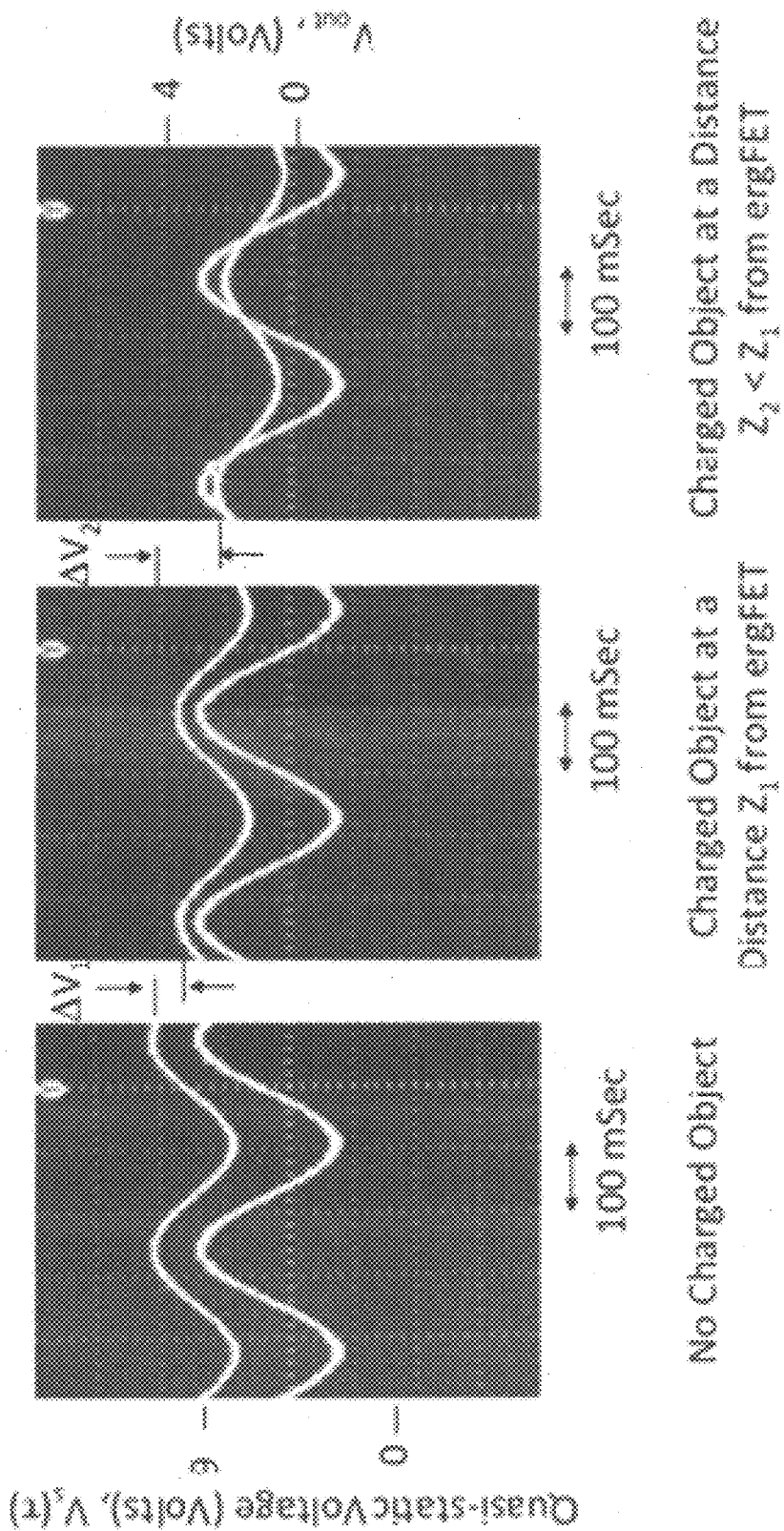

FIG. 6. shows a comparison of graphs of a voltage response with and without a charged object present before a ergFET.

Figure 7:
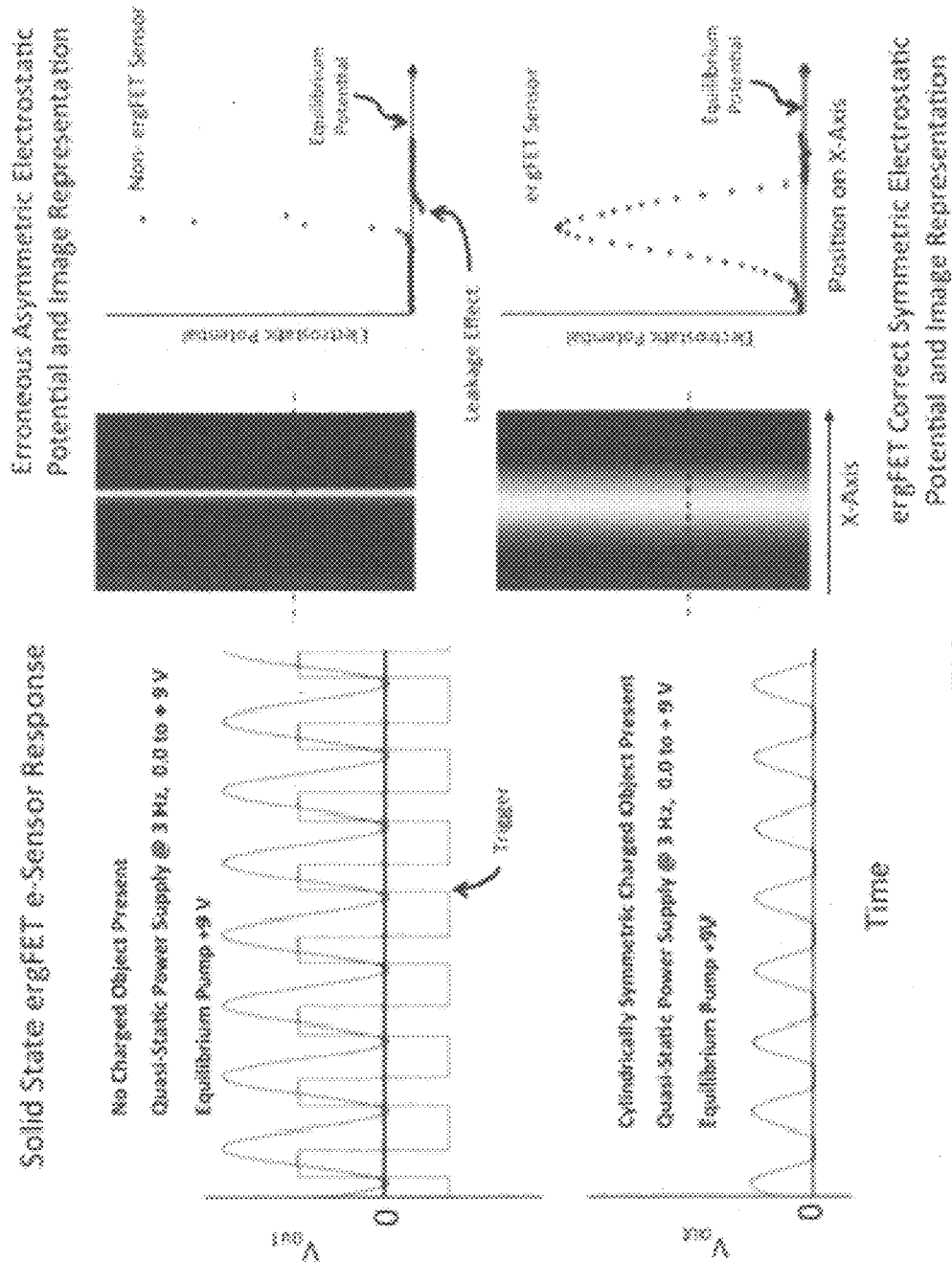

FIG. 7 shows comparative graphs when the charged object is and is not present of the negative edge of the trigger set so the measurement of the voltage out is made at the peaks of the quasi-static power supply potential.

Figure 8:
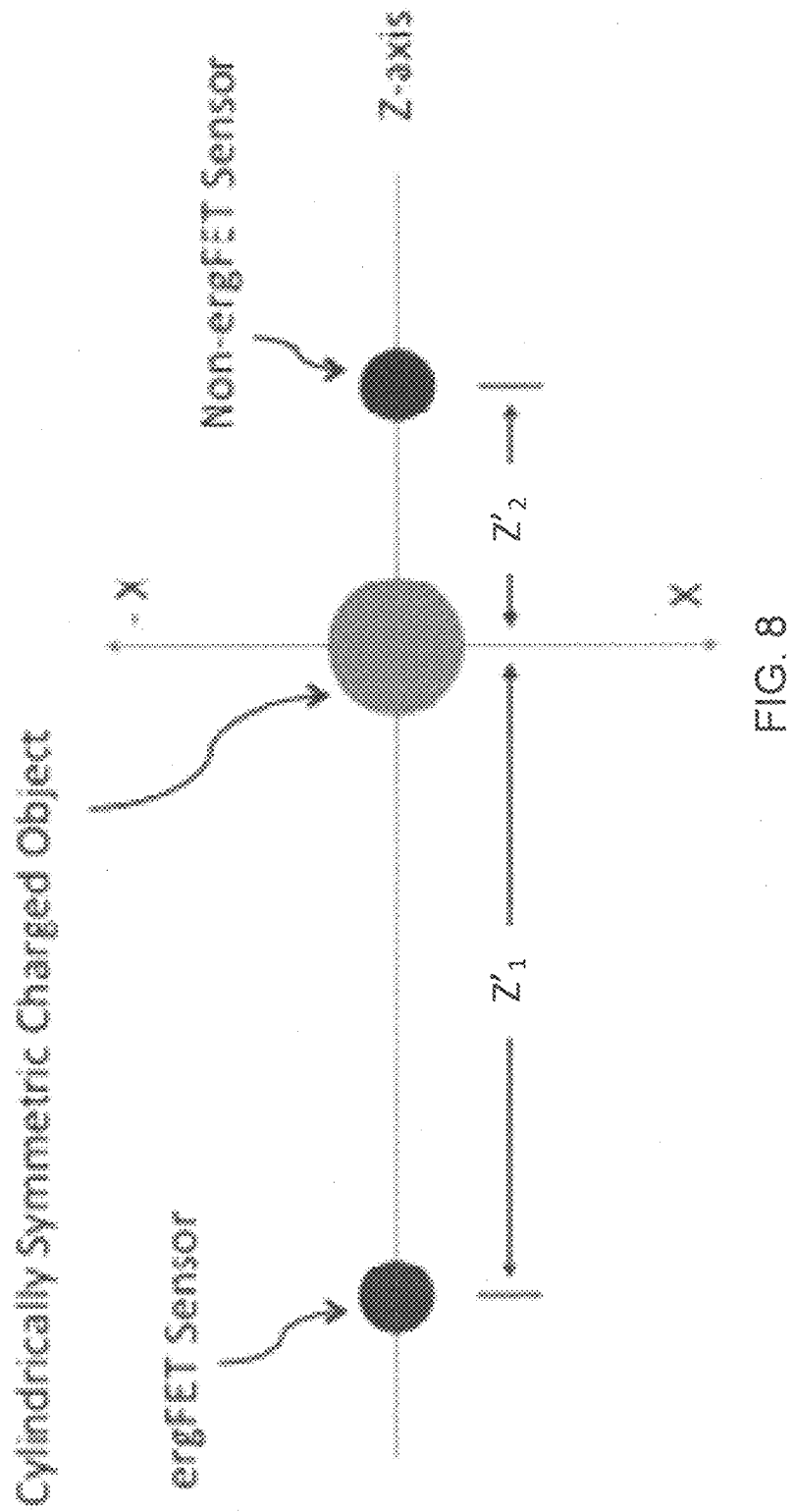

FIG. 8 illustrates the comparative distance of the ergFET and non-ergFET sensors to the charged object used to generate the results shown in the graphs of FIG. 7.

Figure 9:
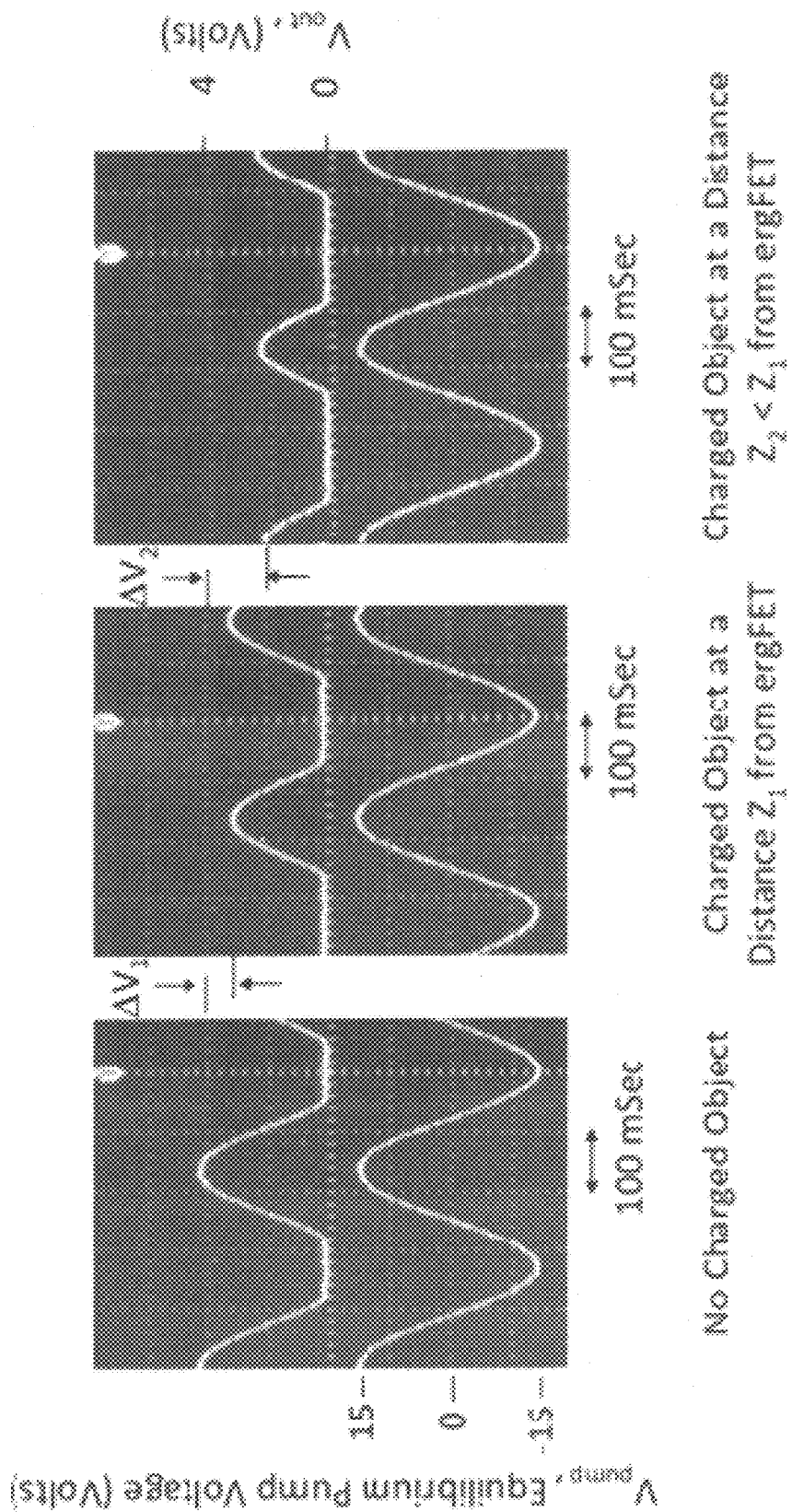

FIG. 9 shows comparative graphs of ergFET response when an oscillating equilibrium pump signal is applied to the equilibrium pump electrode.

Figure 10A:
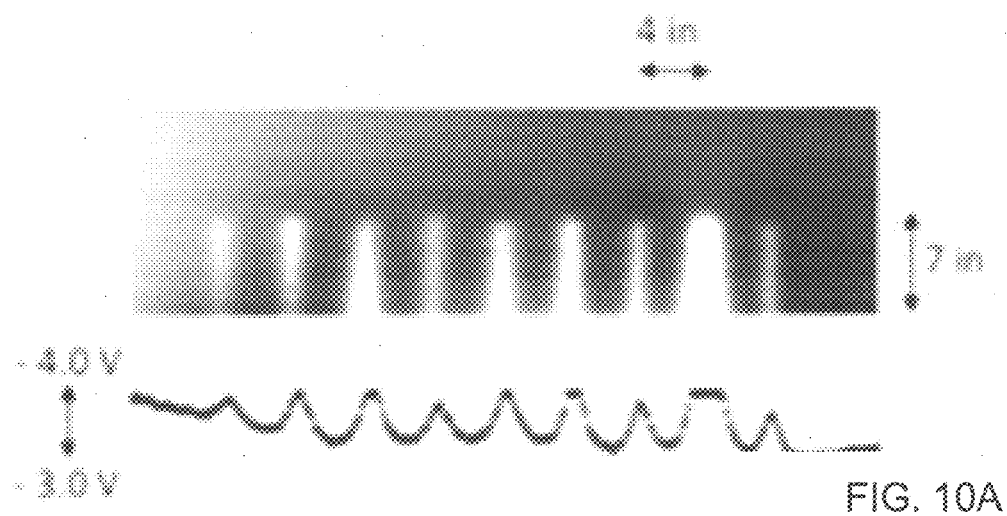

FIG. 10A shows the electrostatic potential image, generated by the quasi-static electric field generator, of nine uncharged solid rods of construction materials in a uniform electrostatic field.

Figure 10B:
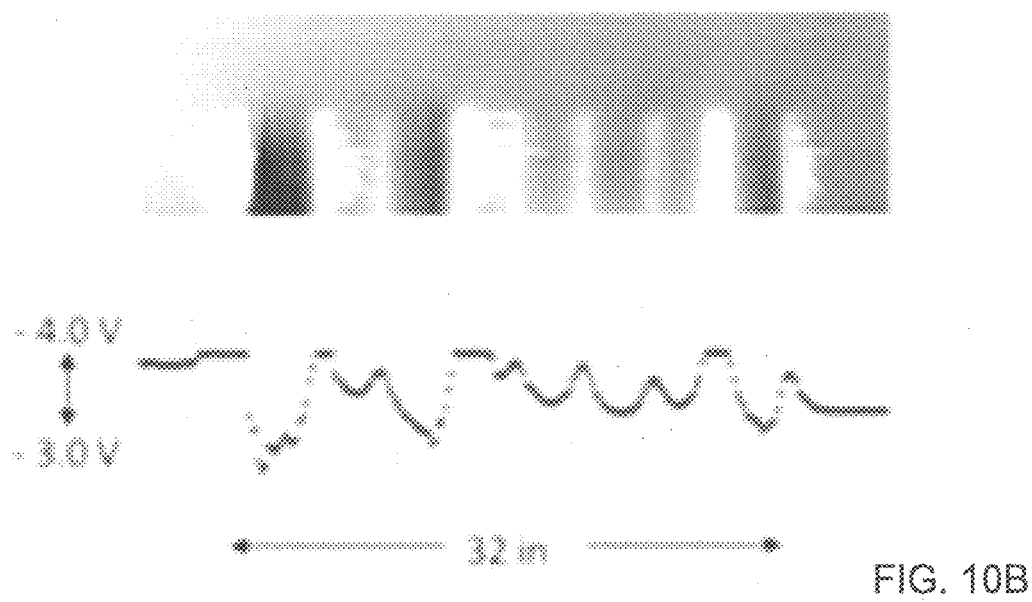

FIG. 10B shows the electrostatic potential of the same series of materials after the each material has been gently and briefly rubbed with a silk cloth to generate a triboelectric charge.

Figure 11:
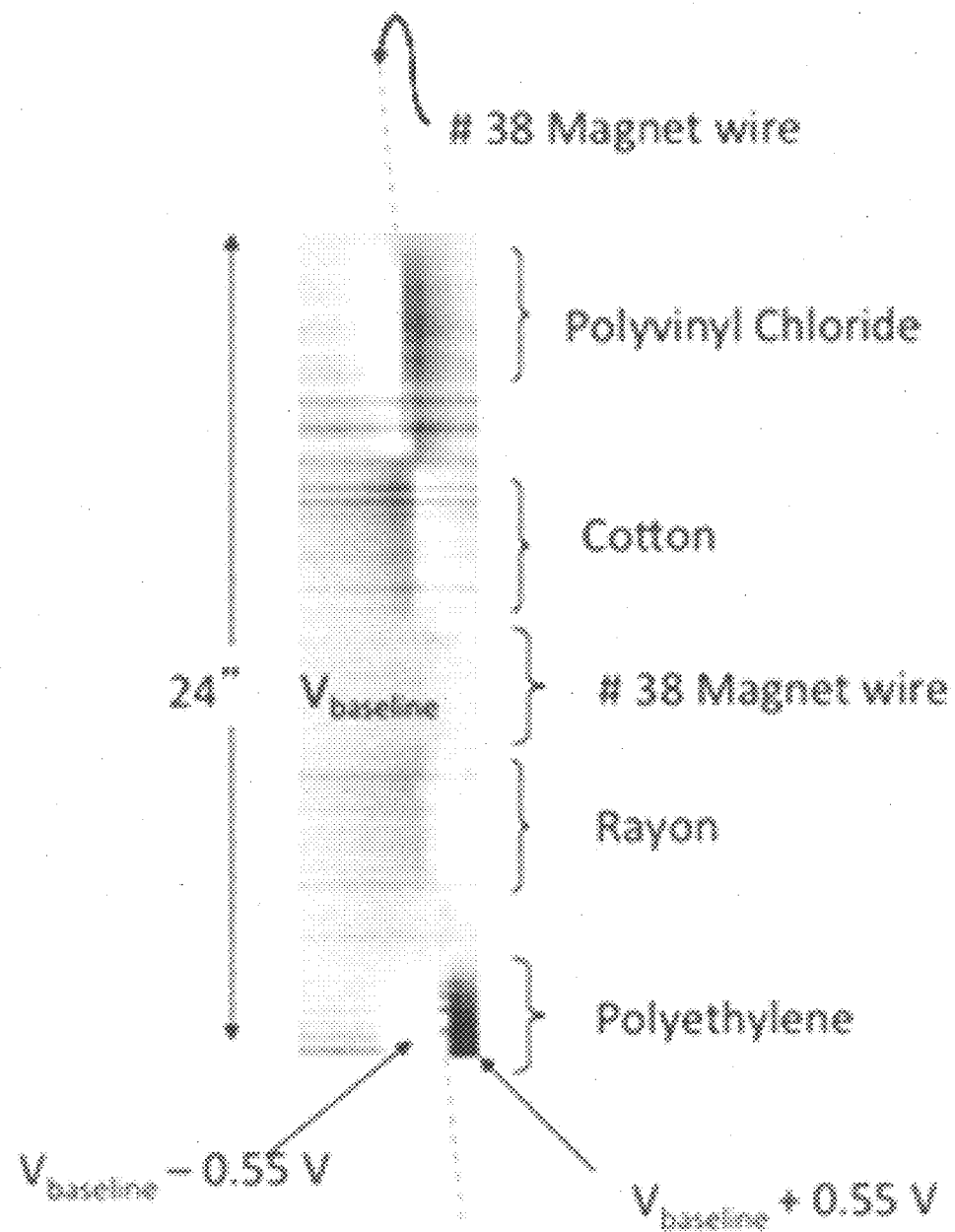

FIG. 11 shows the electrostatic potential distortions that occur when a #38 magnet wire is place in a uniform electrostatic field.

Figure 12:
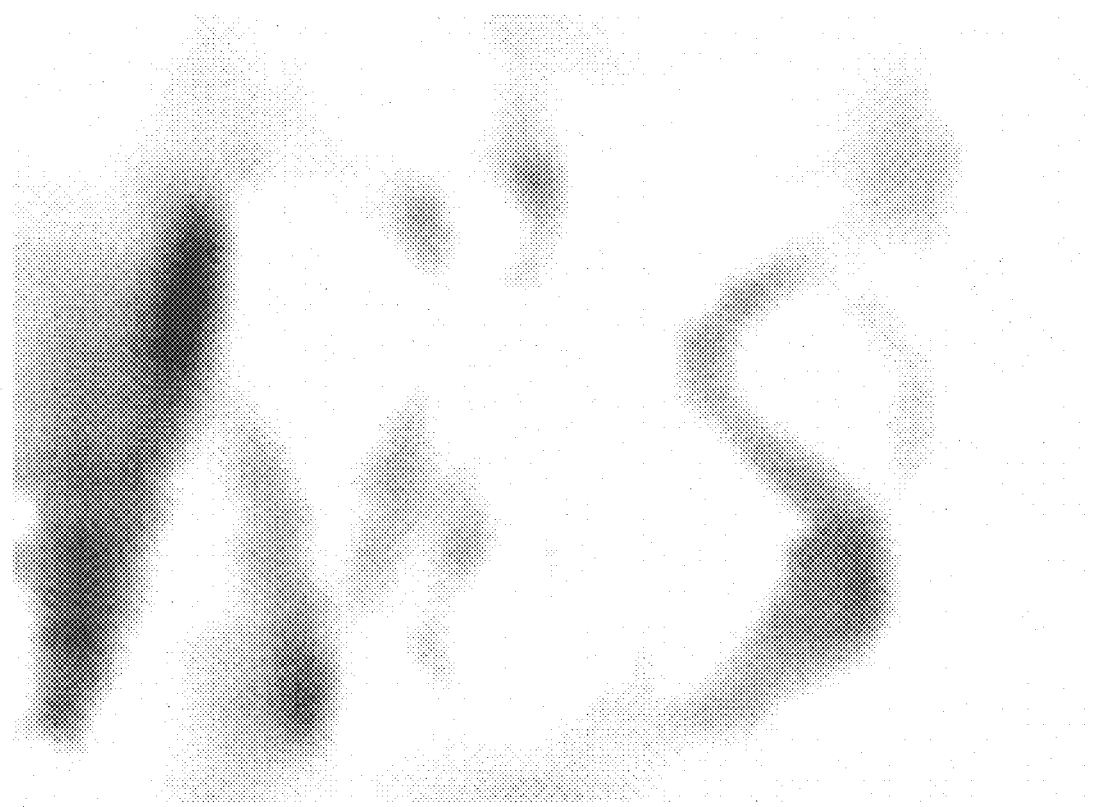

FIG. 12 is a forensic image of text "NASA" triboelectrically drawn with electric charges and imaged by an embodiment solid state ephemeral electric potential and electric field sensor system.

Figure 13:
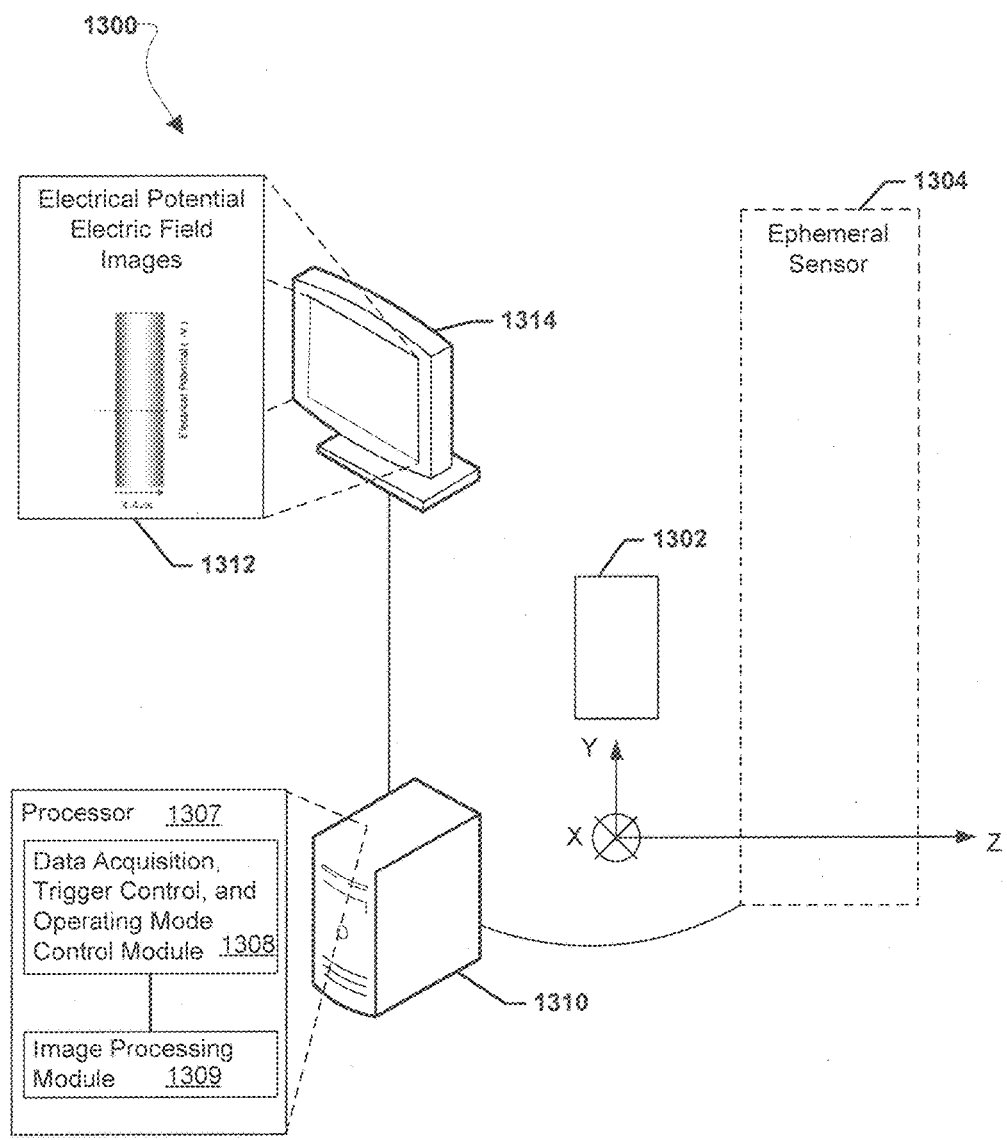

FIG. 13 illustrates an embodiment system for detecting and displaying the electric potential and electric field images of a charged object.

DETAILED DESCRIPTION OF THE INVENTION

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Hence, specific dimensions and other physical characteristics relating to the embodiments disclosed herein are not to be considered as limiting, unless the claims expressly state otherwise.

When making measurements of the true electrostatic potential it is important to make the measurement before leakage free carriers (electron and holes) are allowed to move to equilibrium sites and equilibrium polarization occurs. If these events are allowed to occur, then the original true electric field is now disturbed. The disturbed electric field is a combination of the original electric field, the electric field from the charged carriers at new locations, and the polarization field present. In all electronic systems there are leakage currents. The various embodiments described herein may reduce or eliminate effects of leakage currents. As used herein, the term "leakage currents" means effects due to leakage currents and refers to all effects related to intrinsic electronic properties including leakage of free carriers across electronically insulated boundaries, free carrier build-up, free carrier charging, and all parasitic capacitances, inductances, and impedances. Intrinsic electronic properties may be described with reference to dimensionally increasing volumes of coverage. As examples, intrinsic electronic properties may be solid state level properties, solid state mounting properties, support structure level properties, electrostatic potential and field sensor properties, and/or in some cases may include properties of an object being measured.

Movement of free carrier carriers to equilibrium positions occurs in solid state sensing components having p-n junctions such as field effect transistors (FET). Of particular interest is the ultra high impedance of the FET gates, where impedances at the gate exceed $10^{14}$ ohms. During operation, these high impedances result in a very small and often ignored pico-amp gate current. This current is the most important characteristic of the FET. These currents may also be referred to as leakage currents where free carriers may pass through back-biased diode junctions (JFET) and silicon dioxide gate insulation (MOSFET). These tiny gate currents provide a source or sink for free carriers, depending on the configuration of the FET, that allows the free carrier creation and recombination processes to reach a steady state in the depletion zone when drain and source potentials are fixed. In this manner, for a fixed potential applied directly to the gate providing a direct gate current, there is a steady state creation and recombination of charged carriers in the depletion zone establishing an expanded depletion layer boundary for all time, $\tau$, and that this boundary is often different from the original depletion layer boundary. The size of the depletion layer affects the amount of current flowing between the source and drain electrodes.

The potential at the gate of the FET does not need to be established by a direct electrical connection. A constant potential may be applied to the gate in a non-direct manner by placing the gate in an electrostatic field, while the drain and source potentials are for example fixed. In this configuration, with a fixed gate potential and no direct gate current, the creation and recombination of free carriers is time dependent. At initial potential application time, $\tau=0.0$, the creation and recombination of charged carriers is at the same rate as for the non-zero gate current, and the size of the depletion layer is readily established. However, since there is no direct gate current, the creation and recombination of free carriers does not continue in a steady state mode, but rather charged free carriers build up or charge the gate to effectively change the effective gate potential from its original value at $\tau=0.0$ sec. The depletion layer boundary is returned at a time, $\tau+\Delta\tau$ to its equilibrium state prior to the application of the non-direct potential. This build up of charge is similar to the charging of a perfect capacitor, where there is an initial current of free carriers to charge the capacitor, and once the capacitor is charged the current goes zero. The return of the depletion layer to its original state after the initial application of a constant non-direct potential is an important reason why others have reported electronic signatures, where true electric fields are not present. The equilibrium state is defined here to be the asymptotic steady state condition reached, given a non-direct gate potential and given no direct gate current, at a time $\tau+\Delta\tau$ after the initial application of gate potential at time, $\tau$.

It is also noted that mobile or leakage charged carriers also exist on the structural components that make up the sensing element, wire insulation, as well as the physical structure supporting the sensing element. Each of these sources of charged carriers has a complex relationship between mobilities of each of the carrier types and the time to reach equilibrium. In addition to the movement of charge carriers there are companion parasitic effects of capacitance and inductance and intrinsic resistance between individual elements and electronic zones that make up the construction of the FET solid state elements, the solid state structural and sensor support elements. Each of these parasitic and intrinsic effects affects the equilibrium response of the sensing system. Here the sensing system must be defined, as at a minimum to include, the solid state elements and electronic connections, the support of the solid state elements, the physical sensor support, and all wiring and connection elements. Free carriers are not only affected by electrical potentials applied to FET. Free carriers may also be excited to move to other solid state conduction bands by externally applied magnetic fields and radiation to provide a tailored measurement response. All these mechanisms affect the equilibrium state of the electrostatic sensing system.

The ability to address all of these mechanisms affecting the equilibrium state seems overwhelming. However, some mechanisms are more important than others and the importance also depends on the configuration of sensing systems. A straight forward way to address this complex issue is to, immediately after a measurement of the true electrostatic potential, apply a non-direct electrostatic potential to the FET in such manner as to create an electric field that reverses effects due to leakage currents. The quasi-static electric field generator provides this reversing potential. The success of the quasi-static electric field generator in producing detailed quantitative metric measurements of electrostatic potentials and electrostatic fields and image representations of the electrostatic potential and electrostatic field has led to the development of the electromechanical ephemeral electric field sensor described in U.S. patent application Ser. No. 14/547,390 to Generazio, incorporated herein by reference in its entirety.

The electromechanical ephemeral electric field sensor provides the required non-direct change in electrostatic potential by physically changing the orientation of the sensing gate electrode of the FET, effectively reversing effects due to leakage currents. In this ephemeral configuration a measurement of the true electrostatic potential is made before the FET and sensing system has had time, $\Delta\tau_s$, to return to equilibrium so that true values of the electrostatic potential and field may be made at specified times, or ephemerally. The equilibrium state is defined differently here to be the asymptotic steady state condition reached when there is no direct gate current given any gate potential and that this equilibrium occurs at a time, $\tau+\Delta\tau_s$ after the initial application of gate potential at time, $\tau$.

Physical movement of FET or gate is not the only method for reversing effects due to leakage currents. In the various embodiments, an additional electrode or electrodes may be added to the originally the FET circuit to provide a non-direct application of reversing potential having zero current.

Figure 1:
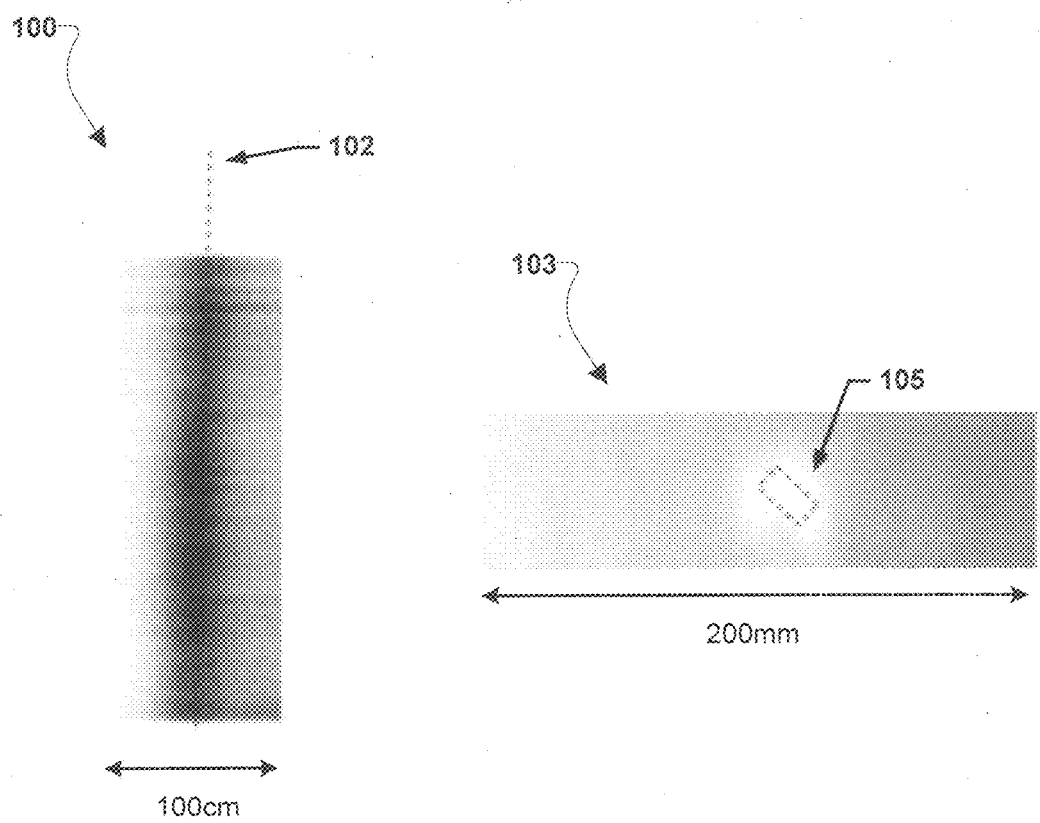
FIG. 1 illustrates two images of electrostatic potential distortions around a cable and an operational amplifier.
Figure 2:
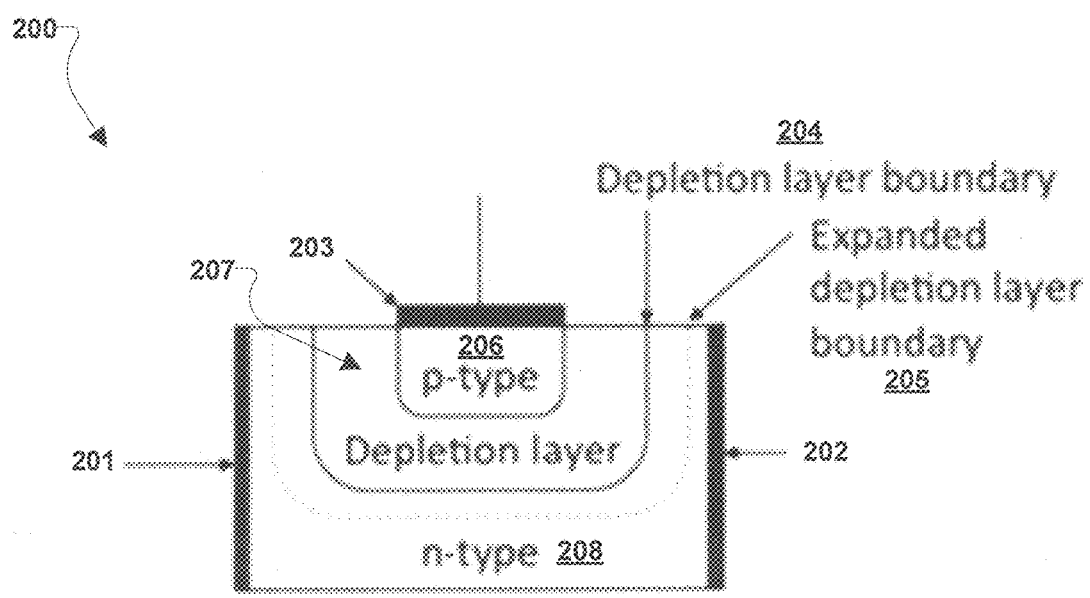
FIG. 2 illustrates an example field effect transistor (FET).

FIG. 2 illustrates an example FET 200, such as a J FET, including a source electrode 201, a drain electrode 202, and a gate electrode 203. The FET 200 may include a p-type layer 206, a depletion layer 207, and a n-type layer 208. The depletion layer boundary 204 (the solid curve) represents the equilibrium boundary given any gate potential given no direct gate current. The expanded depletion layer boundary 205 (the dashed curve) represents the expanded depletion layer when a direct potential is applied to the gate electrode 203 by the gate and a gate current exists. This expanded depletion layer boundary 205 stays fixed if a constant potential and direct current are applied to the gate electrode 203 and given adequate direct potentials applied to the source electrode 201 and drain electrode 202 of the FET 200. The dashed curve also represents the expanded depletion layer boundary 205 when the potential is initially applied to the gate and no direct gate current exist at $\tau=0.0$ sec. This expanded depletion layer boundary 205 returns to the equilibrium boundary (the depletion layer boundary 204) if no direct gate current is applied to the gate electrode 203 and given adequate direct potentials applied to the source electrode 201 and drain electrode 202 of the FET 200. The FET 200 illustrated in FIG. 2 is conceptual illustration of a FET, and the true structure of the p-type layer 206, n-type layer 208, depletion layer 207, and gate, source, and drain electrodes 201, 202, 203, respectively, may vary.

The various embodiments provide a new type of FET that controls equilibrium by reversing the effects of leakage currents affecting the gate response of the FET by using an additional equilibrium pump electrode. These equilibrium reversing gate FETs (ergFETs) of the various embodiments, may include an equilibrium pump electrode located within a non-conducting gap. In this manner, the ergFETs of the various embodiments may include four electrodes, a source electrode, a drain electrode, a gate electrode, and an equilibrium pump electrode located within a non-conducting gap. The equilibrium pump electrodes located within a non conducting gap do not make contact with the solid state elements of the ergFETs of the various embodiments (e.g., the p-type layer, n-type layer, etc.) and are not a source of free carriers. In this manner, the ergFETs of the various embodiments are distinguished from MOSFETs which have four electrodes, a source electrode, a drain electrode, a first gate electrode, and a second electrode, all in direct electrical contact with the solid state elements of the MOSFET and are sources of free carriers.

Figure 3:
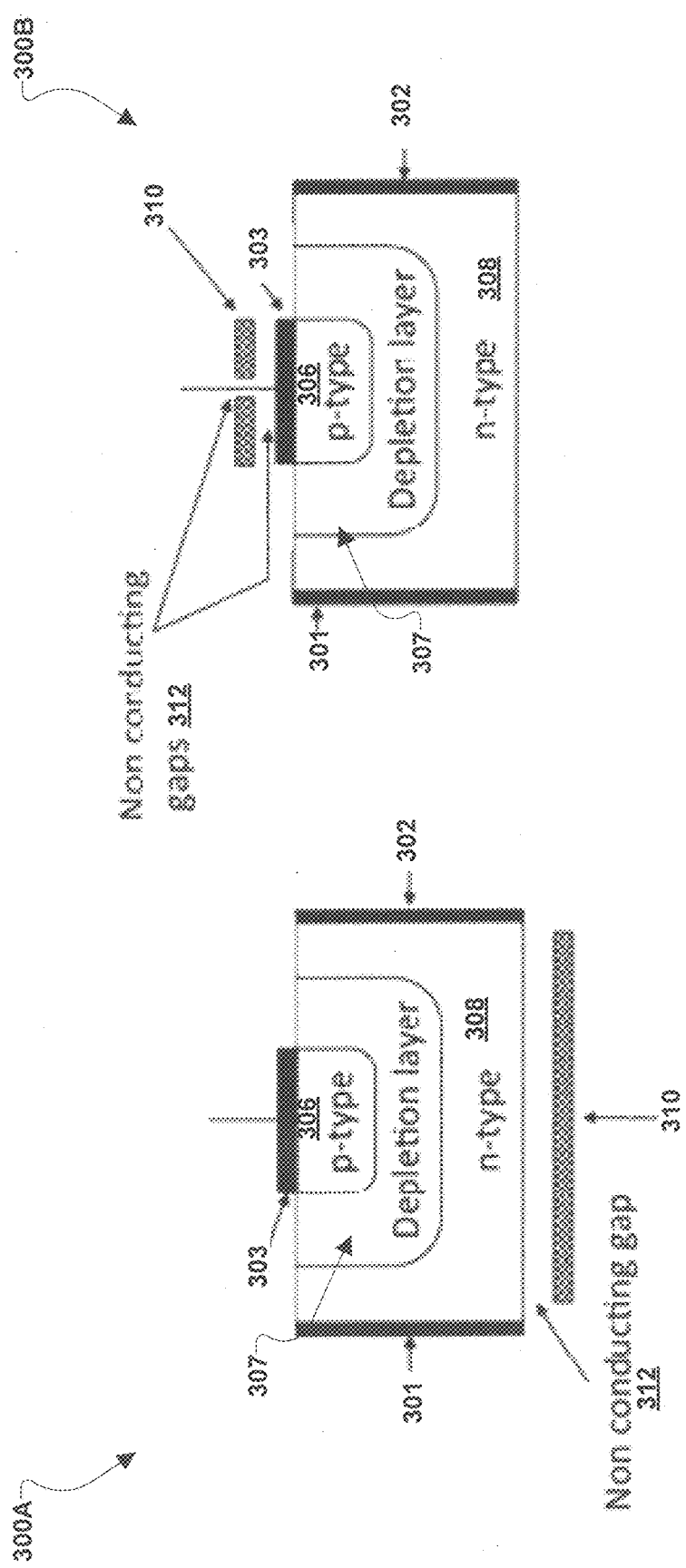
FIG. 3 illustrates two embodiment equilibrium reversing gate FETs (ergFETs).

FIG. 3 illustrates two embodiment ergFETs 300A and 300B that control the equilibrium by reversing the effects of leakage currents affecting the gate electrode 303 response of the ergFETs 300A and 300B by using an equilibrium pump electrode 310 (also referred to as an equilibrium potential electrode). The ergFETs 300A and 300B may include four electrodes, a source electrode 301, a drain electrode 302, and the gate electrode 303, as well as the equilibrium pump electrode 310. The ergFETs 300A and 300B may also include solid state elements, including p-type layer 306, a depletion layer 307, and a n-type layer 308. The location and structure of the equilibrium pump electrode 310 may vary depending on the structure of the ergFETs 300A and 300B. For example, in ergFET 300A the equilibrium pump electrode 310 may be located on a backplane of the ergFET 300A separated by the non-conducting gap 312. As another example, in ergFET 300B the equilibrium pump electrode 310 may be located over the gate electrode 303 separated by the non-conducting gap 312 from the gate electrode 303. In such a configuration the non-conducting gap 312 and equilibrium pump electrode 310 may be configured to allow the gate line to connect to the gate electrode 303, such as with a center tap hole passing through both the non-conducting gap 312 and equilibrium pump electrode 310.

The equilibrium pump electrode 310 does not provide free carriers to the solid state structure of the ergFETs 300A and 300B (i.e., p-type layer 306, a depletion layer 307, and a n-type layer 308) and the equilibrium pump electrode 310 is placed within a non-conducting gap 312 such that the equilibrium pump electrode 310 is not in direct electrical contact with the solid state structure of the ergFETs 300A and 300B (i.e., p-type layer 306, a depletion layer 307, and a n-type layer 308).

A variety of structural approaches may be used to support the equilibrium pump electrode 310. As examples, the equilibrium pump electrode 310 may be supported by external supports to the ergFETs, by point structural contacts that electrically insulate between the equilibrium pump electrode 310 and the body of the ergFETs. by an insulation layer or layers between the equilibrium pump electrode 310 and the body of the ergFETs, etc. With the use of insulation components between the equilibrium pump electrode 310 and the body of the ergFETs there is an added source of leakage free carriers which may enhance or degrade the function of the equilibrium pump electrode 310 depending on the physical construction of the ergFETs. Insulation elements that have impedances greater than the intrinsic gate impendence will provide minimized added effects due to leakage currents, carrier-build-up, and/or charging. The equilibrium pump electrode 310 does not actually have to be attached to the solid state elements of the ergFETs and may be quite remote. However, a remote implementation will required higher magnitude electrostatic potentials to reverse effects of leakage currents. The equilibrium pump electrode 310 may also partially encase the ergFET structure, ergFET electrodes, and/or ergFET contacts. While FIG. 3 illustrates ergFETs 300A and 300B having equilibrium pump electrodes 310 located in a position above the gate electrode 303 or below a p-type layer 306 and a n-type layer 308, the equilibrium pump electrode 310 may be located in positions other than above the gate electrode 303 or below a p-type layer 306 and a n-type layer 308. The equilibrium pump electrode 310 need not be flat, and may have multiple surfaces or volumes to shape the electric field emanating from the equilibrium pump electrode 310 to provide optimum reversal of free carrier build-up and leakage effects. Multiple equilibrium pump electrodes 310 at various locations having varying potentials may be used. For example, an ergFET may include two, three, four, or more equilibrium pump electrodes 310 at different locations having varying potentials.

During measurements there is no direct contact to the gate electrode 303 of the ergFET so that the gate is floating. The potential at the equilibrium pump electrode 303 needs to be maintained at an adequate level such that the ergFET does not return to a permanent equilibrium steady state in the presence of an external electric field. One method to prevent an equilibrium steady state from occurring may be to use a feedback circuit to control the potential on equilibrium potential electrode that is driven by changes in the depletion layer due to potentials at the gate. Another method may be to use a circuit to directly control the potential on equilibrium potential electrode, for example, constant, oscillating or time dependant potential on equilibrium pump electrode may be used. The potential at the source and drain of the ergFET may also be varied to prevent equilibrium state from occurring.

Figure 4:
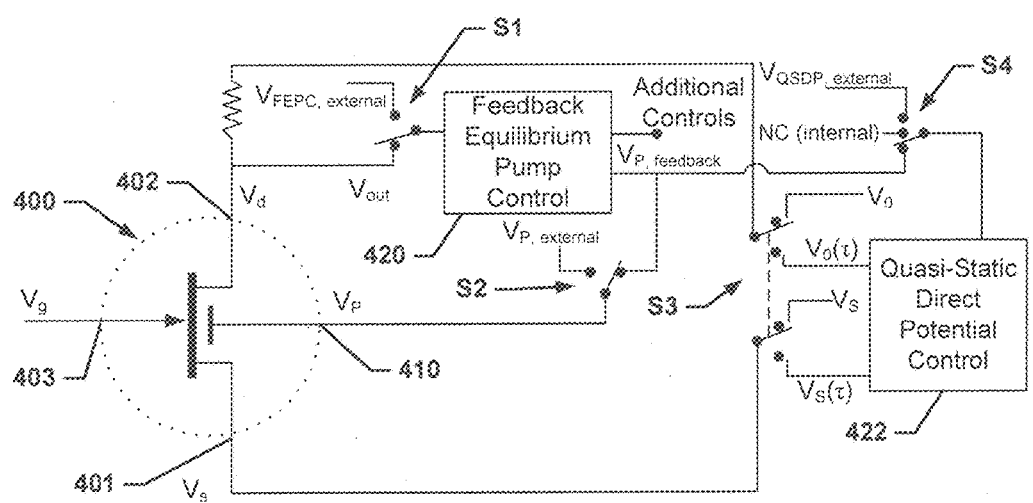
FIG. 4 illustrates a measurement circuit including an ergFET according to an embodiment.

FIG. 4 illustrates a measurement circuit including an ergFET 400 according to an embodiment. The measurement circuit may include the ergFET 400 with a drain electrode 402 connected to a drain line, a source electrode 401 connected to a source line, a equilibrium pump electrode 410 connected to a pump line, and a gate electrode 403 that is connected to a floating gate line. Given a potential $V_g$ at the gate, a feedback equilibrium pump potential control (FEPC) 420 may monitor the voltage $V_{out}$ via switch $S_1$ selection and provides a feedback potential $V_{p,feedback}$ directly to the to the equilibrium pump electrode 410 ($V_p$) by switch $S_2$ selection. $V_d$ and $V_s$ are the drain and source direct potentials, respectively. $V_s$ and $V_0$ or $V_0(\tau)$ may be constant potentials, or externally varied potentials, or varied by the quasi-static direct potential control (QDPC) 422 by switch $S_3$ selection. The QDPC 422 may allow $V_s$ and $V_0$ to, independently, be time varying or constant potentials. The output of the QDPC 422 is controlled by the switch $S_4$ selections. The QSPC 422 may be internally (NC switch $S_4$ selection) or externally controlled by $V_{QSDP,external}$ or by the FEPC 420 via switch $S_4$ selection. External control of the FEPC 420 may be achieved by applying $V_{FEPC,external}$ instead of $V_{out}$ by switch $S_1$ selection. Additional controls may be incorporated for controlling either the FEPC 420, or an external potential $V_{p,external}$ may be applied directly to $V_p$ by switch $S_2$ selection. $V_{FEPC,external}$ and $V_{p,external}$ may be constant potentials or time varying. In the various embodiments the FEPC 420 and/or QDPC 422 may be one or more dedicated circuits, control modules running on one or more processors, or any other type controllers that may provide the operations described herein.

There may be multiple modes of operation for the circuit illustrated in FIG. 4. All modes may have the goal of reversing the effects of leakage currents.

The most basic mode may be to hold the $V_p$ at a constant potential $V_{p,external}$ via switch $S_2$ selection and by applying an oscillating potential $V_s(\tau)$ while holding $V_o(\tau)$ at a fixed potential.

Figure 5:
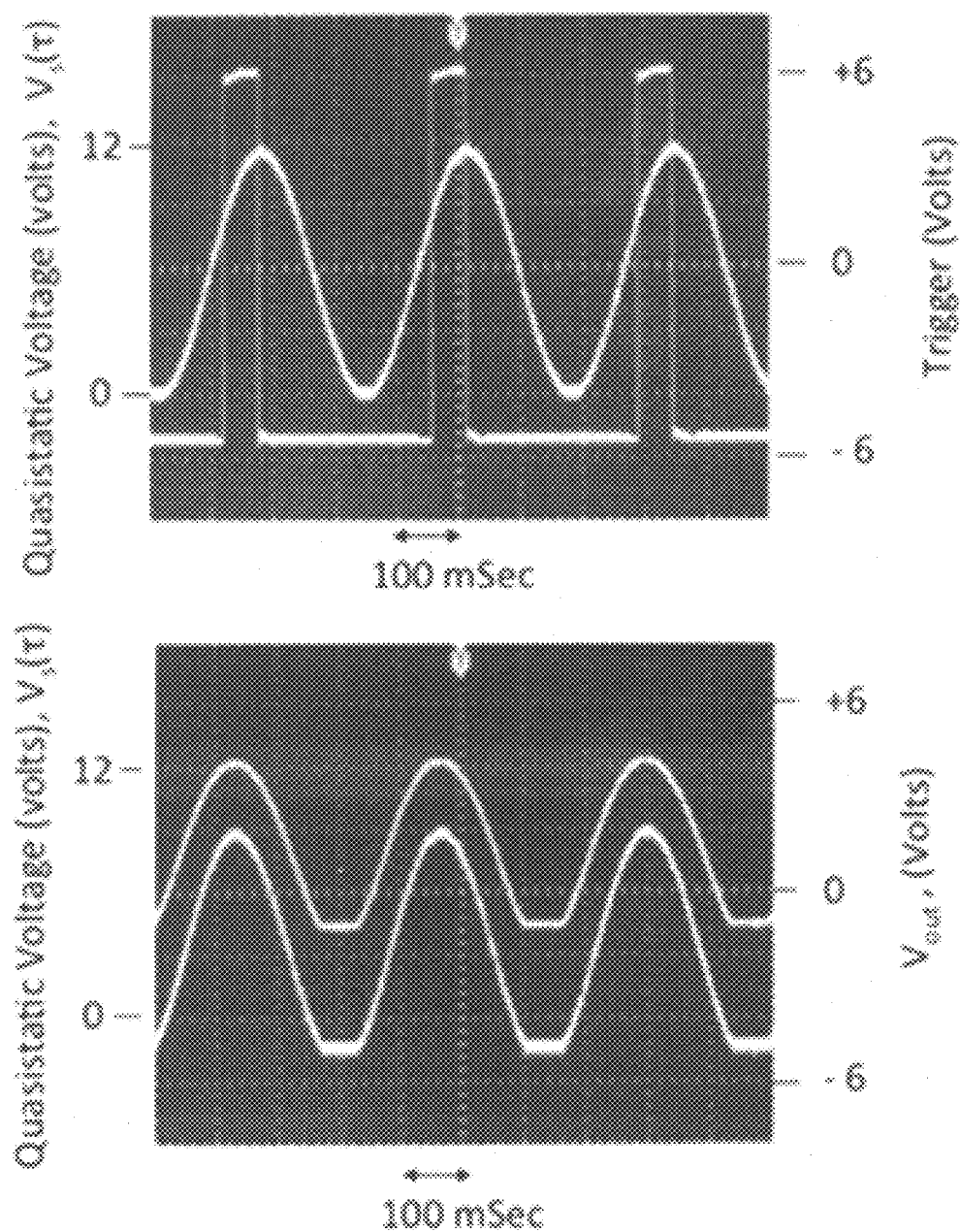
FIG. 5 shows a comparison of graphs of an example quasi-static potential voltage with a trigger voltage and a voltage output.

FIG. 5 shows an example quasi-static potential $V_s(\tau)$ (sinusoidal curve) with $V_0(\tau)=0.0$ volts. A triggering voltage is also shown in the upper graph. In this example, the measurement of $V_{out}$, representing the potential at the gate, will be made at the peak of the quasi-static potential, that is, at the time where the negative edge of the trigger voltage occurs. Other triggering configurations and times may be used depending on the data required. The quasi-static potential $V_s(\tau)$ may go below zero to assist in cancelling effect do to leakage currents as shown in the lower graph of FIG. 5. The lower graph in FIG. 5 also shows a typical $V_{out}$ response given the quasi-static potential shown in the same image.

FIG. 6 shows a $V_{out}$ response with and without a charged object present. $V_{out}$ changes by $\Delta V_1$ and $\Delta V_2$. when a statically charged object is placed at two different positions $Z_1$ and $Z_2$. respectively. Here the quasi-static voltage $V_s(\tau)$ is oscillating but does not go to zero, $V_o(\tau)$ is held at 0.0 volts. $V_p$ via $V_{p,external}$ and switch $S_2$ selection is at a constant potential. Measurement of $V_{out}$ may be made at other times and measurements carry additional information for characterizing leakage effects and object dielectric properties.

FIG. 7 shows the negative edge of the trigger set so the measurement of the $V_{out}$ is made at the peaks of the quasi-static power supply potential. $V_{out}$ is shown when the charged object is and is not present. Here the equilibrium pump potential $V_{p,external}$ is used via switch $S_2$ selection and is fixed. In this configuration the electrostatic potential measurement from the ergFET 400 when a cylindrically charged object is moved along the X-axis that is placed a fixed distance $Z'_1$ from the ergFET 400 (illustrated in FIG. 8 discussed below) is shown along with an image representation of the electrostatic potential of the charged object as function of distance along the X-axis. The lighter shade is more negative than the electrostatic potential without or far from the charged object.

The ergFET 400 response is measuring an electrostatic potential that is symmetric about the axis of symmetry the charged object as expected. From this response, and the ergFET 400 calibration, the true electrostatic potential may be obtained. To illustrate the difference between ergFET 400 and non-ergFET sensors, FIG. 7 also shows the electrostatic potential measurement for non-ergFET based sensor (e.g., a sensor using a FET without an equilibrium pump electrode, such as FET 200 of FIG. 2) when a cylindrically charged object is moved along the X-axis that is placed a fixed distance $Z'_2$ from the non-ergFET sensor along with an image representation of the electrostatic potential of the charged object as function of distance along the X-axis. The lighter shade is more negative than the electrostatic potential without or far from the charged object. The non-ergFET sensor (illustrated in FIG. 8 discussed below) response exhibits an asymmetric electrostatic potential about the axis of symmetry of the charged object, and a potential tail (labeled leakage effects in FIG. 7) of opposite polarity due to leakage effects. This type of asymmetric signal is observed in other FET based sensors and may be misinterpreted in electronic signatures to be a charged object being followed by an oppositely charged object. When this type of asymmetric signal response is observed it is evidence of effects due to leakage currents and likely to be due to the sensor configuration and not due to the objects true electrostatic potential. The two data sets shown on the right of FIG. 7 were obtained simultaneously.

The ergFET 400 sensitivity was much greater than that of the non-ergFET sensor so that the ergFET 400 was placed at a distance along the Z-axis that was ten times greater than that for the non-ergFET sensor as shown in FIG. 8. FIG. 8 illustrates the comparative distance of the ergFET 400 and non-ergFET sensors to the charged object used to generate the results shown in the graphs of FIG. 7. As shown in FIG. 7, the response of the ergFET 400 to electrostatic fields is similar to that observed for the electromechanical ephemeral electric field sensor described in U.S. Provisional Patent Application No. 61/906,068. Quantitative calibration between the true value of the electrostatic potential at the gate $V_g$ and $V_{out}$ may be made using linear, non-linear, and/or lookup table approaches.

An oscillating pump may be used to provide an oscillatory equilibrium pump potential to reverse effects of leakage currents. Oscillatory frequencies will be in the quasi-static range, as previously defined in U.S. patent application Ser. No. 13/800,379 filed Apr. 24, 2012 (herein incorporated by reference in its entirety), or greater. In this mode, the ergFET 400 is repeatedly forced to return to an equilibrium state or closest approach to equilibrium. FIG. 9 shows the ergFET 400 response when equilibrium pump $V_{p,external}$ is selected via switch $S_2$ and is a sinusoidal±15 volt oscillatory potential as shown (lower curve) in the figure. In this example, $V_0$ and $V_s$ are held at fixed potentials, via switch $S_3$ selection. Note that during much of the negative portion of the pump voltage, the $V_{out}$ has a value of zero indicating that the ergFET 400 is pinched to an off condition due to the applied pump potential. Measurements of the potential at the gate of the ergFET 400 may be made at the peaks of the applied pump potential as shown in FIG. 9. Other measurement times may be used rather than at the peaks. The trigger signal is not shown in FIG. 9. FIG. 9 shows typical $V_{out}$ response (upper curves) with and without a charged object present. $V_{out}$ changes by $\Delta V_1$ and $\Delta V_2$, when a statically charged object is placed at two different positions $Z_1$ and $Z_2$, respectively. From this response, and sensor calibration, the true electrostatic potential may be obtained.

Changes in the equilibrium state may occur independent of the sensor design. For example, a charged object may provide free carriers to the gate without direct contact. In some ergFET designs or measurement configurations, the closest approach to the equilibrium state may be used as the measurement time, while keeping track of the closest approach offset voltage and time of occurrence from the original equilibrium state. Measurements at other times may be made to assist in measurement and characterization of free carrier creation, recombination, and leakage rates, object dielectric properties, etc. The measurement frequency may vary depending on the free carrier leakage rates in the solid state elements of the ergFET and the supporting structural design.

In a more complex continuous monitoring feedback mode, $V_s$ and $V_0$ are constant potentials in time, while $V_p$ is continuously adjusted to maintain $V_{out}$ at fixed value. For example, as an electrostatic potential $V_{out}$ is measured, the FEPC 420 monitors $V_{out}$ via S to supply $V_{p,feedback}$ via $S_2$ to $V_p$ so that the ergFET 400 remains in an equilibrium state. The feedback output $V_{p,feedback}$ may also be oscillatory, or a complex function of time. Quantitative calibration between the true value of the electrostatic potential at the gate $V_g$ and the pump voltage $V_p$ are made using linear, non-linear, and/or lookup table approaches.

Modes of operation are not limited to feedback from the ergFET's 400 output $V_{out}$, and other feedback controls elements or parameters may be incorporated, such as, temperature, humidity, etc. Each of these parameters may be independent or dependent controls incorporated into the FEPC 420.

A wide selection of methods may be used to provide the needed pump feedback, $V_{p,feedback}$, e.g., operational amplifiers, voltage controlled resistors, automatic gain circuits, etc., and their combinations may be used. The feedback control circuit does not need to be a separate element from the ergFET and may be included as an intrinsic element of the ergFET design. Although the ergFET shown here is demonstrated and based on a JFET design, the same concept of reversing effects of leakage currents and free carrier build-up, may be applied to all other FET systems, MOSFET, MISFET, IGFET, etc., and the concept of applying an equilibrium pump potential applies to other non-FET based electrostatic measurement systems that exhibit free carrier leakage, free carrier build-up, and their parasitic effects. The concept applies to static and quasi-static measurement systems. The ergFET does not require an ultralow direct gate current. The gate current of the ergFET is zero having infinite impedance and a zero direct gate current are unique characteristics of the ergFET.

The construction of the support for the ergFET is of great importance as the supports provide a source of free carriers as well as a source and modifier of extraneous electrostatic fields. Typical construction materials used in sensor construction impact the accuracy and usefulness of the electrostatic measurement sensors. Construction materials have a dramatic effect on measurements of electrostatic potential. FIG. 10A shows the electrostatic potential image, generated by the quasi-static electric field generator, of nine uncharged solid rods of construction materials in a uniform electrostatic field. From left to right side of the image the materials are Teflon® (PTFE), acrylic, oak wood, nylon, garolite, mica-ceramic, borosilicate glass, copper, and polyester (PET).

If the material has a significant effect on the electric field passing through and around the material, then this material is not the best construction material to be used when making measurements of the true electrostatic potential. The electrostatic fields are generally considered to be emanating from or terminating on surfaces, while a companion displacement electrostatic field is described to exist internal to dielectric objects. The phrase "passing through" refers to an external electric field line that impinges on a surface point of a dielectric object, in which a companion internal displacement electrostatic field line is created at that point due to the presence of the external electrostatic field. The created internal displacement electrostatic field line extends through the dielectric body to impinge on a different point on the dielectric surface, thereby creating a companion electrostatic field line that emanates from the surface of the dielectric body. The field lines are generally curved and not necessarily straight. In this sense the electrostatic field is "passing through" a dielectric object. Therefore any change in the potential from its original value without the rod is significant. More directly, if one can image a representation of an object in a uniform electrostatic field, then there are significant changes in the electrostatic field due to the objects presence. What constitutes significant is dependent on the evaluation requirement. Note that the electrical potential becomes less negative (darker shade) at distances away from the rods. However, the electrostatic potential rapidly becomes more negative (lighter shade) near the rods. The copper rod has the most dramatic effect in changing the electrostatic potential. Therefore the use of copper, a common component of sensors and electronic circuits, and similar materials may be avoided in the construction of electrostatic sensors. The structure in the images of the electric potential for the Teflon®(PTFE), acrylic, oak wood, nylon, garolite, mica-ceramic, borosilicate glass, copper, and polyester (PET) rods is a result of the polarizing dielectric properties and conduction properties of the rods affecting the intensity and direction of the electrostatic field at the measurement location.

FIG. 10B shows the electrostatic potential of the same series of materials after the each material has been gently and briefly rubbed with a silk cloth (other materials may be used) to generate a triboelectric charge. The Teflon® (PTFE), acrylic, nylon, and polyester produce such a large magnitude change, due to the triboelectric charging, from the base line electrostatic potential, that the electric field sensor experienced a temporary pinch-off before partially recovering to provide measurements on the adjacent rod. When the depletion region expands fully at a pinch-off potential $V_g$, the source to drain resistance becomes large and current no longer flows in the channel. In this case, the quasi-static electric field generator, was unable to fully reverse leakage effects in the sensors after pinch-off occurred. A pinch-off state is to be avoided for accurate measurements of the electrostatic potential. Physically moving the charged rods to a distance further away from the sensors is one method that avoids pinch-off conditions, other methods include adjusting the positive and negative potentials on the quasi-static generator. Materials easily triboelectrically charged should be avoided as sensor construction and support materials. Of particular interest, is that although Mylar® has been claimed as being triboelectrically acceptable for sensor development, but the measurements shown here indicate that Mylar®, a polyester, significantly degrades the accuracy of electrostatic measurements. When comparing dielectric properties of the rods and their triboelectric affinities as shown in Table 1 below, the triboelectric affinity dominates the selection materials for the construction of ergFETs. Not only is triboelectrically neutral preferred, but also the difference between triboelectric affinities between adjacent materials experiencing contact is to be minimized. From FIG. 10B, if silk or other contact materials are present, then oak wood, Garolite, mica-ceramic, and borosilicate glass may be favored in the development of electrostatic potential and field sensors. In Table 1, $\in$ is the dielectric constant. Materials with dielectric constants at or near 1.0 do not support bound surface charges and therefore do not polarize in the presence of an electric field. In addition to triboelectric neutrality, selection of materials with dielectric constants at or near 1.0 may be preferred for the construction of ergFETs in the various embodiments.

TABLE 1

Dielectric Properties and Triboelectric Affinities of Rods

| $\in$ | Material (Left to Right In FIG. 10A & 10B) | Affinity |
|---|---|---|
| 2.0-2.1 | Teflon | −190 |
| 2.7 | Acrylic (Lucite) | −10 |
| 1.2-2.1 | Wood | +7 |
| 3 | Nylon | +30 |
| 5-5 | Garolite | +30 |
| 4-9 | Mica ceramic | |
| 3.8 | Borosilicate Glass | +25 |
| | Copper | ~0 |
| 2.8-4.1 | Polyester (Mylar) | −40 |

FIG. 11 shows the electrostatic potential distortions that occur when a #38 magnet wire is place in a uniform electrostatic field. The magnet wire is covered with various insulation materials, polyvinyl chloride (PVC), Cotton, rayon (made from naturally occurring polymers), and polyethylene, and the entire wire system was gently rubbed briefly with a silk cloth. Without the wire or insulation materials present the electrostatic potential is at a $V_{baseline}$. All the insulation materials distort the electrostatic field to some extent, with polyvinyl chloride and polyethylene exhibiting the largest changes in electrostatic potential. These insulation materials should be avoided in the construction of electrostatic potential sensors. In contrast, the small diameter copper magnet wire leaves the electrostatic potential relatively unchanged due to the wire's presence, so small diameter wires may be preferred. In view of FIG. 11, other insulation materials with non-neutral triboelectric properties may be avoided in electrostatic measurement systems. Measurements of the true triboelectric insulation effects should be measured prior to selection for use in electrostatic measurement systems. These results indicate that the true electrical potential measurements may not be made without specific care in selection of the sensor supporting and connection hardware. The sensor solid state construction, support materials, wiring or other connections to the electrostatic sensor should be triboelectrically neutral and with dielectric constants at or near 1.0.

It is important to recognize that it may be attractive to use FEPC and QSPS frequencies that exceed the quasi-static range, e.g., to increase the data acquisition speed or spatial resolution of the electrostatic potential, however, these higher frequencies generate a propagating electrodynamic wave. The measured potentials may be a combination of electrostatic and propagating spatially polarized electrodynamic fields which may often be unrelated to the electrostatic potential.

FIG. 12 is a forensic image of text "NASA" triboelectrically drawn (by touch with a finger) with electric charges and imaged by an embodiment solid state ephemeral electric potential and electric field sensor system. The last "A" in "NASA" was highly charged and saturated the sensing system.

FIG. 13 illustrates an embodiment system 1300 for detecting and displaying the electric potential and electric field images of a charged object 1302. In an embodiment, the solid state ephemeral electric potential and electric field sensor system 1300 may comprise at least one electric field sensor 1304 including a measurement circuit including an ergFET, such as the measurement circuit including an erg-FET 400 described above with reference to FIG. 4. As illustrated in FIG. 13, in an embodiment, a charged object 1302 may be placed in front of the solid state ephemeral electric potential and electric field sensor 1304. The sensor 1304 may be connected to a processor 1307 of a computer 1310, such as by one or more wires (e.g., mode control, power control, trigger control, and/or measurement cables). The sensor 1304 and the processor 1307 of the computer 1310 may send/receive electrical signals with one another including mode, power, and trigger control signals sent to the sensor 1304 from the computer 1310 and/or measurement signals sent from the sensor 1304 to the computer 1310. The processor 1307 of the computer may have various modules running on it, including a data acquisition, trigger control, and operating mode control module 1308 and/or an image processing module 1309. The electric potential as a function of three spatial coordinates, x, y, and z, and time may be recorded by the data acquisition, trigger control, and operating mode control module 1308 running on the processor 1307 of the computer 1310 in response to the measurement signals received from the sensor 1304. The measured data may be processed by the image processing module 1309 to generate images 1312 of electric potential, electric field spatial vector components (Ex, Ey, and Ez), electric field vector, and electric field magnitude for output on a display 1314 connected to the processor 1307 of the computer 1310. In an embodiment, processor 1307 and/or one or more of the modules 1308 and/or 1309 may be part of a dedicated circuit board. For example, the data acquisition, trigger control, and operating mode control module 1308 may be a dedicated circuit board coupled to the processor 1307 and the solid state ephemeral electric field sensor 1304 and configured with various pieces of hardware to provide the functionality of the data acquisition, trigger control, and operating mode control module 1308 described herein. The processor 1307 and/or one or more of the modules 1308 and/or 1309 may control the solid state ephemeral electric field sensor 1304, including controlling the measurement circuit including the ergFET, such as the measurement circuit including the ergFET 400 described above with reference to FIG. 4. As examples, the processor 1307 and/or one or more of the modules 1308 and/or 1309 may control one or more of switches $S_1$, $S_2$, $S_3$, and/or $S_4$, as well as generating and controlling the $V_{FEPC,external}$, $V_{p,external}$, and/or $V_{QSDP,external}$ potentials.

The various embodiments may be useful in military and civilian applications. The various embodiments may be used to detect and inspect personnel, baggage, wire insulation, hidden objects, subterranean variations, material properties, materials, material damage, material age, material integrity, structural variations, etc. Inspection capabilities provided by the various embodiments include inspection and characterization of liquid, solid, emulsion, foam, insulating, semi-conducting, conducting, metallic, non-metallic, polymer, ceramic, composite, etc., materials and complex structures and their substructures. The various embodiments may provide for security detection of hidden solid metallic systems, such as metallic guns, and nonmetallic polymer and ceramic weapons and explosives. Applications of the various embodiments also include product quality control and intruder detection. Larger and smaller versions and arrays of the various embodiments are envisioned to be applicable to a wide variety of inspection and monitoring needs. Remote measurement of human muscle electrical potential include measurement and imaging of cardiac polarization wave, remote EKG, assistance in diagnosis of muscle related diseases, measurement and imaging of intra-cranial electrical potentials, and measurement and imaging of triboelectric properties on materials and systems may be provided by the various embodiments. Additionally, the various embodiments may provide for remote health monitoring of astronauts; launch, on-orbit, and during extra vehicular activity. The various embodiments may provide for electronic property characterization of equipment, components, space vehicles, tethers, etc., and/or dielectric characterization of materials and structures, metrification of electronic signatures of materials, and characterization of aging wires. Further, the various embodiments may provide for remote characterization of hidden dielectric structures.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

As discussed herein, a processor may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into a processor. A processor may include internal memory sufficient to store the application software instructions. In many devices the internal memory may be a volatile or nonvolatile memory, such as flash memory, or a mixture of both. For the purposes of this description, a general reference to memory refers to memory accessible by a processor including internal memory or removable memory plugged into the device and memory within the processor itself.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product. The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "exemplary embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

What is claimed is:

1. A field effect transistor (FET), comprising:
   a source electrode;
   a drain electrode;
   a gate electrode; and
   an equilibrium pump electrode located in a non-conducting gap of the FET.

2. The FET of claim 1, wherein the equilibrium pump electrode is configured to reverse the effect of a leakage current of the gate electrode.

3. The FET of claim 2, wherein the gate electrode is in a floating gate electronic configuration.

4. The FET of claim 3, wherein the equilibrium pump electrode is located above the gate electrode or is located below a p-type layer or a n-type layer of the FET.

5. The FET of claim 3, wherein the equilibrium pump electrode is located in a position other than above the gate electrode or below a p-type layer or a n-type layer of the FET.

6. The FET of claim 3, further comprising at least one additional equilibrium pump electrode configured to reverse the effect of a leakage current of the gate electrode.

7. A solid state ephemeral electric potential and electric field sensor system, comprising:
   a field effect transistor (FET), comprising:
      a source electrode;
      a drain electrode;
      a gate electrode; and
      an equilibrium pump electrode located in a non-conducting gap of the FET.

8. The system of claim 7, wherein the equilibrium pump electrode is configured to reverse the effect of a leakage current of the gate electrode.

9. The system of claim 8, wherein the gate electrode is in a floating gate electronic configuration.

10. The system of claim 9, wherein the equilibrium pump electrode is located above the gate electrode or is located below a p-type layer or a n-type layer of the FET.

11. The system of claim 9, further comprising:
    a measurement circuit including the FET, the measurement circuit comprising:
       a feedback equilibrium pump control configured to provide a pump potential to the equilibrium pump electrode of the FET; and
       a quasi-static direct potential control configured to provide a source potential to the source electrode and a drain potential to the drain electrode of the FET.

12. The system of claim 11, wherein:
    the feedback equilibrium pump control is configured to monitor the drain potential of the FET; and
    the pump potential is based at least in part on the drain potential of the FET.

13. The system of claim 11, wherein the pump potential is a constant, an oscillating, or a time dependant potential.

14. The system of claim 13, wherein the source potential and the drain potential are constant potentials or varied potentials.

15. The system of claim 13, further comprising:
a display; and
a processor connected to the display and the measurement circuit, wherein the processor is configured with processor executable instructions to perform operations comprising:
controlling the measurement circuit to perform electrical potential measurements;
receiving the electrical potential measurements from the measurement circuit;
generating images based at least in part on the received electrical potential measurements; and
outputting the images on the display.

16. The method of claim 15, wherein the FET is an array of FETs.

17. An ephemeral electric potential and electric field measurement method, comprising:
receiving, at a processor, electrical potential measurements from a measurement circuit including a field effect transistor (FET), the FET comprising:
a source electrode;
a drain electrode;
a gate electrode; and
an equilibrium pump electrode located in a non-conducting gap of the FET;
generating, at the processor, images based at least in part on the received electrical potential measurements; and
outputting, from the processor, the images on a display.

18. The method of claim 17, wherein:
the equilibrium pump electrode is configured to reverse the effect of a leakage current of the gate electrode; and
the gate electrode is in a floating gate electronic configuration.

19. The method of claim 18, further comprising:
providing a pump potential to the equilibrium pump electrode of the FET; and
providing a source potential to the source electrode and a drain potential to the drain electrode of the FET,
wherein:
the pump potential is a constant, an oscillating, or a time dependant potential; and
the source potential and the drain potential are constant potentials or varied potentials.

20. The method of claim 19, further comprising monitoring the drain potential of the FET, wherein providing the pump potential to the equilibrium pump electrode of the FET comprises providing the pump potential based at least in part on the drain potential of the FET.

* * * * *